United States Patent
Lin

(10) Patent No.: US 10,505,577 B2
(45) Date of Patent: Dec. 10, 2019

(54) HANDHELD ELECTRONIC DEVICE WITH DROP PROTECTION

(71) Applicant: GIGA-BYTE TECHNOLOGY CO., LTD., New Taipei (TW)

(72) Inventor: Shih-Yuan Lin, New Taipei (TW)

(73) Assignee: GIGA-BYTE TECHNOLOGY CO., LTD., New Taipei (TW)

(*) Notice: Subject to any disclaimer, the term of this patent is extended or adjusted under 35 U.S.C. 154(b) by 0 days.

(21) Appl. No.: 16/199,012

(22) Filed: Nov. 23, 2018

(65) Prior Publication Data

US 2019/0165825 A1 May 30, 2019

(30) Foreign Application Priority Data

Nov. 24, 2017 (TW) .............................. 106140933 A

(51) Int. Cl.
| | | |
|---|---|---|
| *H04B 1/3888* | (2015.01) | |
| *G06F 1/16* | (2006.01) | |
| *H01F 7/06* | (2006.01) | |
| *H04B 1/3827* | (2015.01) | |
| *H04M 1/02* | (2006.01) | |

(52) U.S. Cl.
CPC ......... *H04B 1/3888* (2013.01); *G06F 1/1626* (2013.01); *G06F 1/1656* (2013.01); *H01F 7/06* (2013.01); *H04B 1/3833* (2013.01); *H04M 1/026* (2013.01); *H04M 2250/12* (2013.01)

(58) Field of Classification Search
CPC ............. H04M 1/185; H04M 2250/12; H04M 1/0202; H04M 1/026; H04M 1/3833; H04M 1/02; G06F 1/1656; G06F 1/1626; G06F 2200/1633; G06F 1/16; G06F 1/169; H04B 1/3888; H04B 1/3833; H01F 7/06; H05K 5/0217
See application file for complete search history.

(56) References Cited

U.S. PATENT DOCUMENTS

| | | | |
|---|---|---|---|
| 7,059,182 B1 | 6/2006 | Ragner | |
| 8,804,948 B2* | 8/2014 | Lee | ................... H05K 5/02 379/437 |
| 9,116,668 B2* | 8/2015 | Xiaozhuo | ............. G06F 1/1656 |
| 9,571,150 B2 | 2/2017 | Sanford et al. | |
| 9,612,622 B2* | 4/2017 | Moon | .................. G06F 1/1656 |
| 9,715,257 B2 | 7/2017 | Manullang et al. | |
| 10,315,828 B2* | 6/2019 | Rivellini | .............. B65D 81/054 |
| 2019/0059542 A1* | 2/2019 | Mukherjee | ............. A45C 11/00 |

FOREIGN PATENT DOCUMENTS

TW            I425341            2/2014

* cited by examiner

*Primary Examiner* — Nam T Huynh
(74) *Attorney, Agent, or Firm* — Muncy, Geissler, Olds & Lowe, P.C.

(57) ABSTRACT

A handheld electronic device with drop protection, comprising a body, a sensor, at least one buffer and at least one driving part. The body has a front surface, a back surface and at least one side. The sensor is disposed in the body and generates a control signal when the handheld electronic device is dropping. The at least one buffer is disposed on the side of the body, which has a front portion and a back portion extending in different directions and is driven to rotate at an angle so that the front portion and the back portion protruding from the front surface and the back surface of the body respectively. The at least one drive part is disposed in the body and connected to the buffer for driving the buffer to rotate at the angle while receiving the control signal.

9 Claims, 5 Drawing Sheets

HANDHELD ELECTRONIC DEVICE WITH DROP PROTECTION

CROSS-REFERENCE TO RELATED APPLICATIONS

This application claims the benefit of the filing date of Taiwan Patent Application No. 106140933, filed on Nov. 24, 2017, in the Taiwan Intellectual Property Office, the disclosure of which is incorporated herein in its entirety by reference.

BACKGROUND OF THE INVENTION

1. Field of the Invention

The present invention relates to a handheld electronic device, such as the mobile phones, tablets, calculators and so on, and more particularly a handheld electronic device that provides protection from drop impact.

2. Description of the Related Art

Portable handheld electronic devices have become prevalent as a result of the miniaturization of the electronic components, but as its functions continue to develop and expand, the prices of such devices are also increasing.

For instance, high end smart phones, tablets and etc., are not cheap; therefore, once it is broken, such as when the display panel is damaged, the cost for repair is usually expensive, not to mention the inconveniences the user will have to endure not having access to the phone during the repair period. To solve the problem, many proposals have been submitted, such as Taiwan patent number I425341, U.S. Pat. Nos. 9,612,622, 7,059,182, 9,571,150, 9,715,257 and so on. All of these proposals disclose a mobile phone with drop protection, wherein when the internal circuit in the mobile phone detects an event of drop, it will enable a plurality of protective devices to immediately eject or protrude so that the plurality of protective devices can protect the mobile phones to avoid broken.

Wherein, U.S. Pat. No. 9,612,622 discloses a mobile phone with a protective device on all four corners respectively, each of which not only protrudes a cover at the direction of the corner but also separately protrudes a protective pad from the two sides of the front and the back of the cover to form a protective state so that neither side, the top surface, the bottom surface, the corners and the sides do not collide with the ground when the mobile phone is dropped. However, the conventional protective devices requires at least three protruding motions at various directions, with one motion triggering another. Therefore, we can imagine that the structures of the conventional protective devices will be complicated and difficult to manufacture and assemble, and driving up the overall cost.

SUMMARY OF THE INVENTION

It is an object of the present invention to provide a handheld electronic device with drop protection, comprising a body, a sensor, at least one buffer and at least one driving part. The body has a front surface, a back surface and at least one side. The sensor is disposed in the body and generates a control signal when the handheld electronic device is dropping. The at least one buffer is disposed on the side of the body, which has a front portion and a back portion extending in different directions and is driven to rotate at an angle so that the front portion and the back portion protruding from the front surface and the back surface of the body respectively. The at least one drive part is disposed in the body and connected to the buffer for driving the buffer to rotate at the angle while receiving the control signal.

In one embodiment, the buffer is driven to protrude a distance from the body by the driving part.

In one embodiment, the buffer is driven to protrude and rotate synchronously by the driving part.

In one embodiment, the buffer further comprises a spiral shaft fixed between the front portion and the back portion. The spiral shaft extends into the body to connect to the driving part.

In one embodiment, the driving part comprises a housing, a compression spring, and a buckle. The housing has a long hole A for the spiral shaft to penetrate. The compression spring is disposed in the housing, storing elastic force while the spiral shaft is retracted into the housing so that the compression spring is pressed by the spiral shaft, and pushing the spiral shaft to protrude the housing by the elastic force. The buckle fastens the buffer, and releasing the buffer while receiving the control signal to allow the spiral shaft of the buffer to protrude the housing.

In one embodiment, the long hole of the housing has two opposite long sides abutting to the spiral shaft respectively, so that the spiral shaft is guided by the shape of the spiral shaft itself and the long hole to turn or reverse at the angle while protruding from or retracting into the long hole.

In one embodiment, the buckle comprises a tab protruding into a slot of the buffer so as to fasten the buffer, and retracting and detaching the slot while receiving the control signal.

In one embodiment, the handheld electronic device further comprises an electromagnetic valve. The electromagnetic valve drives the tab of the buckle to protrude into the slot of the buffer so as to fasten the buffer, and to retract and detach the slot while receiving the control signal.

In one embodiment, the body has a recess to accommodate the buffer.

In one embodiment, each two adjacent sides form a corner, and the buffer is disposed at the corner of the body.

The foregoing and other objectives, features, and advantages of the invention will be more readily understood upon consideration of the following detailed description of the invention, taken in conjunction with the accompanying drawings.

DETAILED DESCRIPTION OF EMBODIMENTS

Figure 1:
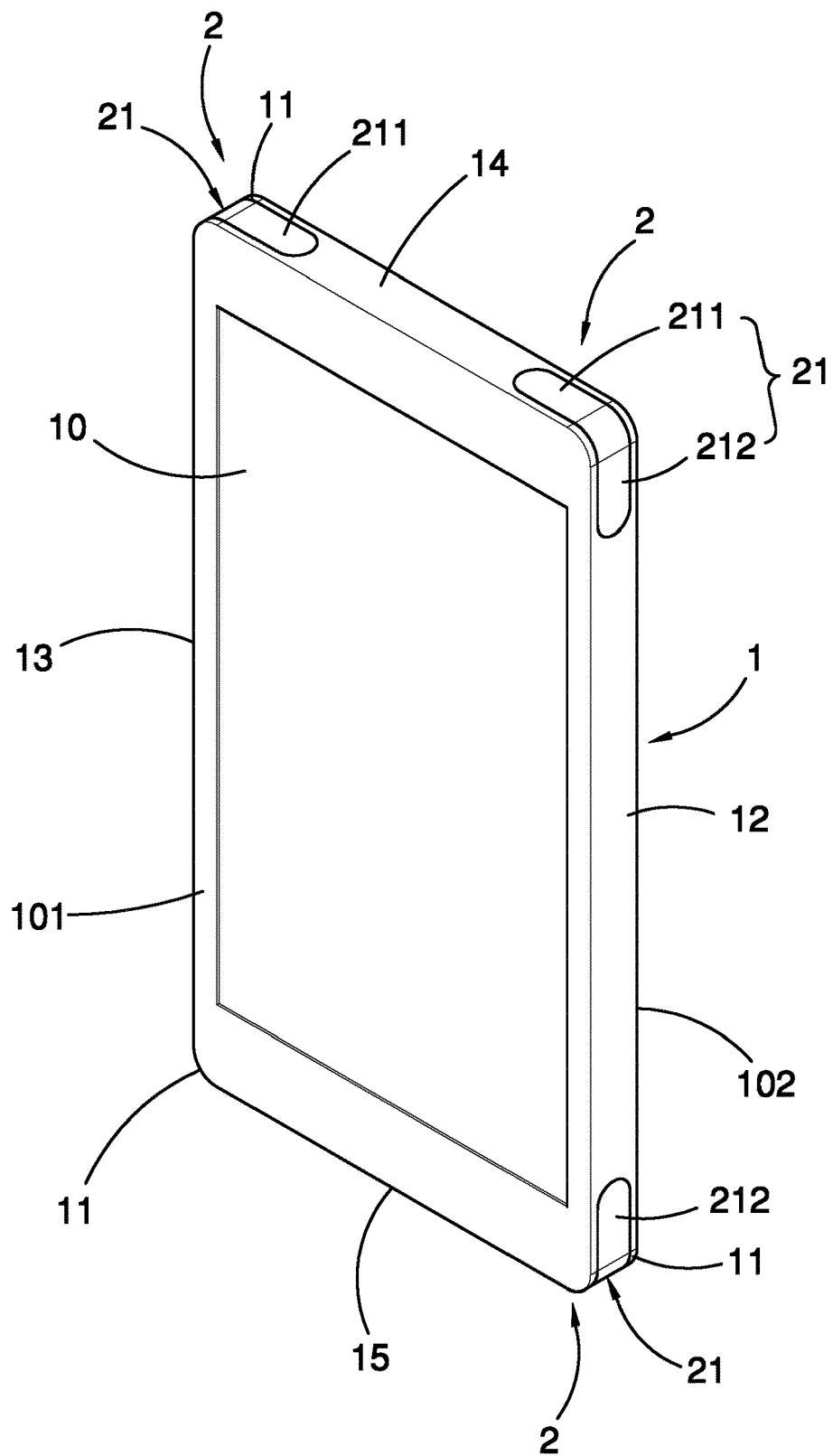
FIG. 1 is a stereogram of the handheld electronic device at an initial state in accordance with an embodiment of the present invention.

FIG. 1 illustrates an embodiment of the invention for the handheld electronic device capable of protection from drop impact. The handheld electronic device includes a body 1, a plurality of protective devices 2 and a sensor (not shown). The sensor is disposed in the body 1. The sensor generates a control signal to each of protective devices 2 when the handheld electronic device is dropping, wherein the handheld electronic device includes but not limited to a smart phone or a tablet. In the embodiment, the handheld electronic device is a smart phone and the sensor is the built-in acceleration sensor disposed in the smart phone, namely G-sensor. When the acceleration sensor detects that the handheld electronic device is in the state of free fall, which indicates that a drop is occurring, meaning that the handheld electronic device is dropping from the hand of the user. At the time, the acceleration sensor generates the control signals to the protective devices 2 so that each protective device 2 transforms from the initial state of FIG. 1 to the protective state of FIG. 6. The details of the actions will be described as below.

As shown in FIG. 1, the body 1 has a wide front surface 101 and a back surface 102 and a plurality of narrow sides. The front surface 101 has a monitor 10. The plurality of the sides includes a right side 12, a left side 13, an top side 14 and a bottom side 15, wherein the junction of each two adjacent sides forms a corner 11. Each protective device 2 includes a buffer 21. The buffers 21 are disposed at the different corners 11 or on the different sides. For example, if there are four protective devices 2, the buffers 21 can be disposed at the corners 11 of the body 1 separately, as shown in the figure, but also can be disposed at the right side 12, the left side 13, the top side 14 and/or the bottom side 15 of the body 1. If there are three protective devices 2, the buffers 21 can be disposed at three of the corners 11 of the body 1 or disposed on three of the sides. If there are only two protective devices 2, the buffers 21 can be disposed at the two corners of the diagonal of the body 1, or disposed on the opposite sides. The body 1 even can dispose only one protective device. The number of the protective devices is not limited to the aforementioned number; however, the preferred number of the protective devices is three or more for full protection.

Furthermore, the shape of the body 1 is not limited to oblong as shown in the figure, but also can be oval, round or the shape without the corner 11 mentioned above while the protective devices 2 are disposed on the side of the body 1.

Figure 2:
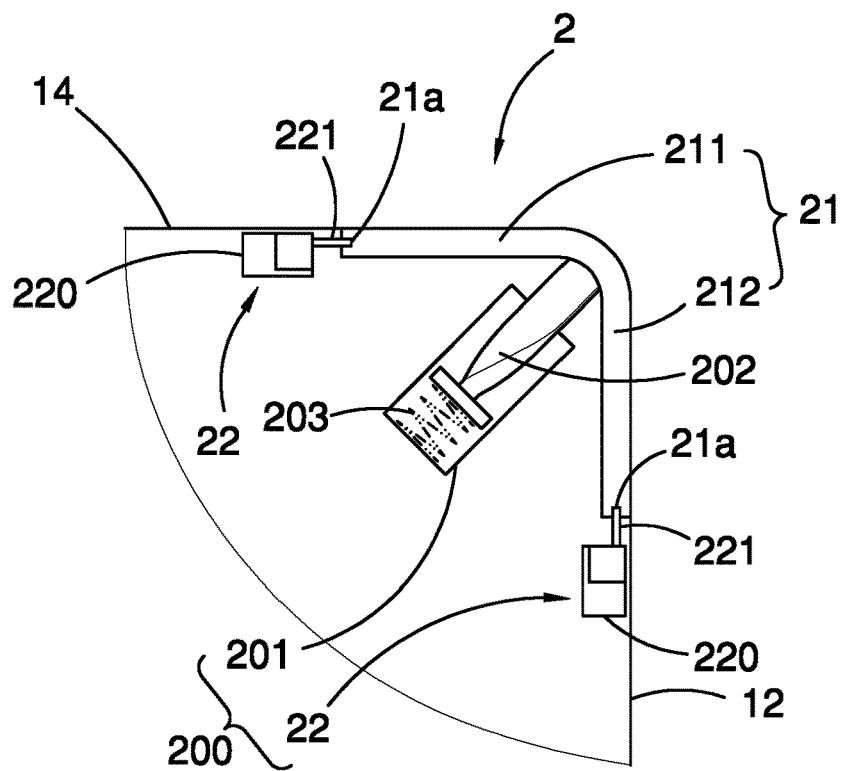
FIG. 2 is a plan view of one of the protective devices at the initial state in accordance with the embodiment.
Figure 3:
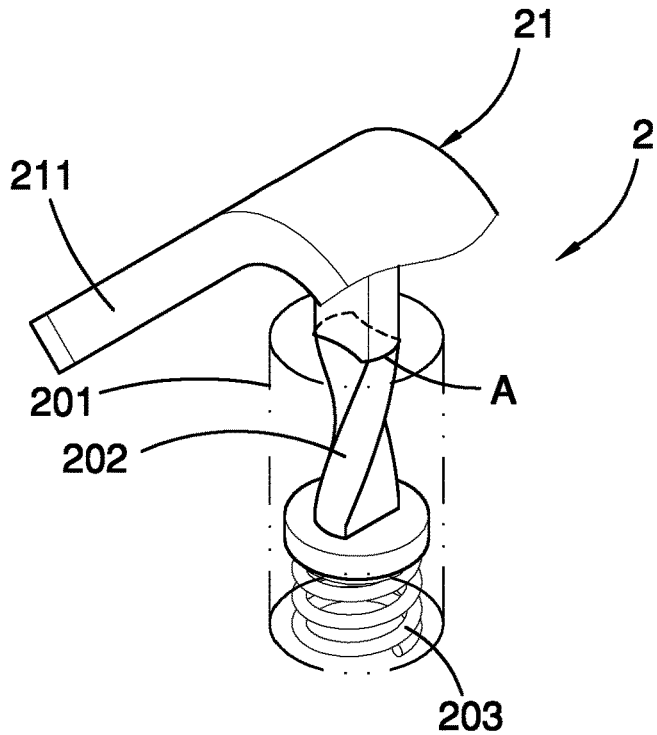
FIG. 3 is a stereogram of the one of the protective devices at the initial state in accordance with the embodiment.

Each buffer 21 is made of the materials of plastic or rubber, but not limited to those. As shown in FIG. 1 to FIG. 3, each buffer 21 has a front portion 211 and a back portion 212 extending in the different directions respectively. In the preferred embodiment, since the buffers 21 are disposed at each corner 11 of the body 1, the front portion 211 and the back portion 212 of each of the buffer 21 form an L-shaped part so as to closely attach to the adjacent sides of the body 1 in the initial state. For instance, in FIG. 1, the front portion 211 and the back portion 212 of the buffer 21 at top right position are respectively attached to the top side 14 and the right side 12 of the body 1. However, if the buffers 21 are disposed on each side of the body 1 respectively, the front portion 211 and the back portion 212 of each of the buffers 21 can form a long flat straight part so as to attach to the same side of the body 1 in the initial state.

Figure 6:
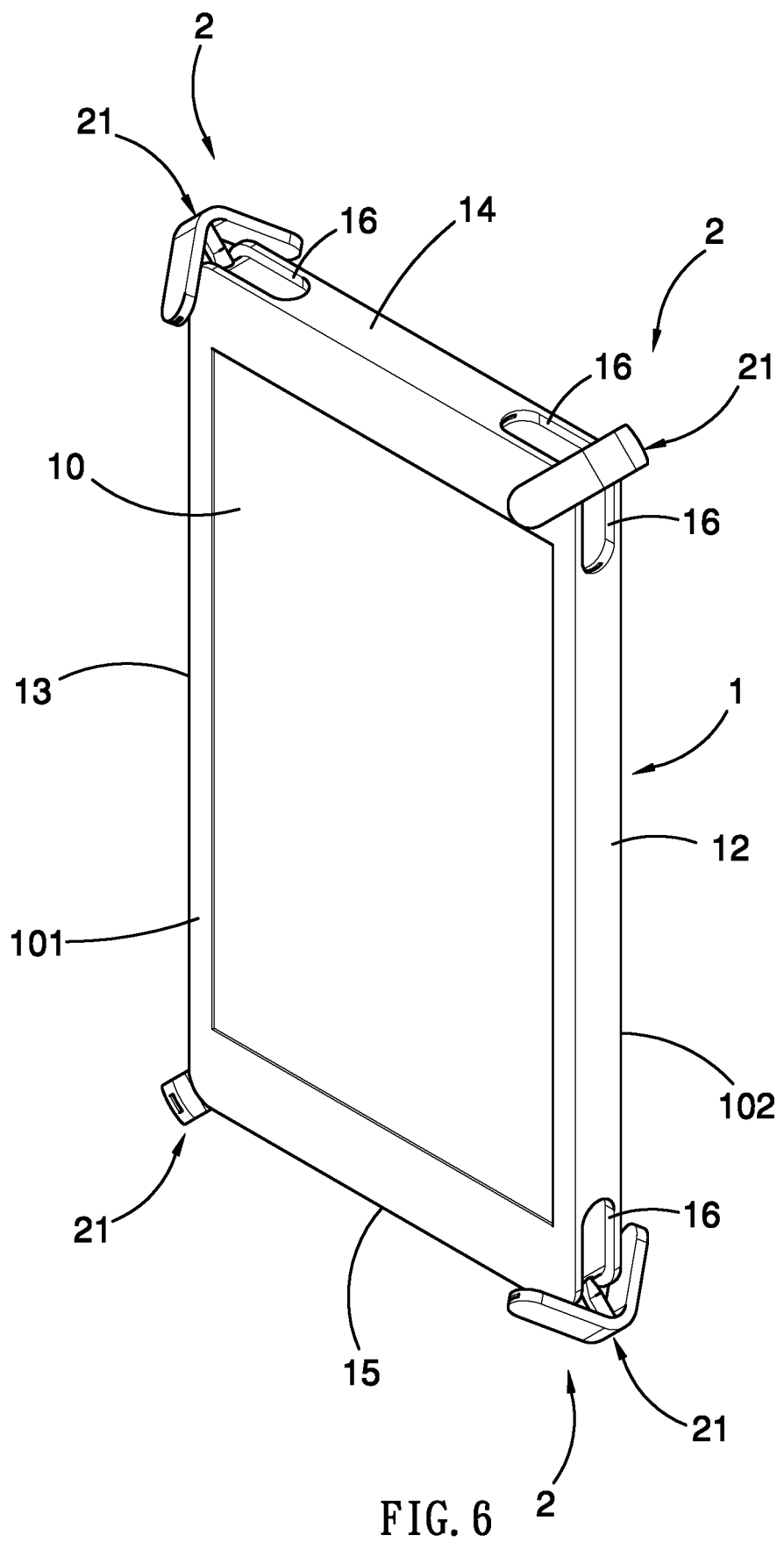
FIG. 6 is a stereogram of the handheld electronic device at the protective state in accordance with the embodiment.
Figure 7:
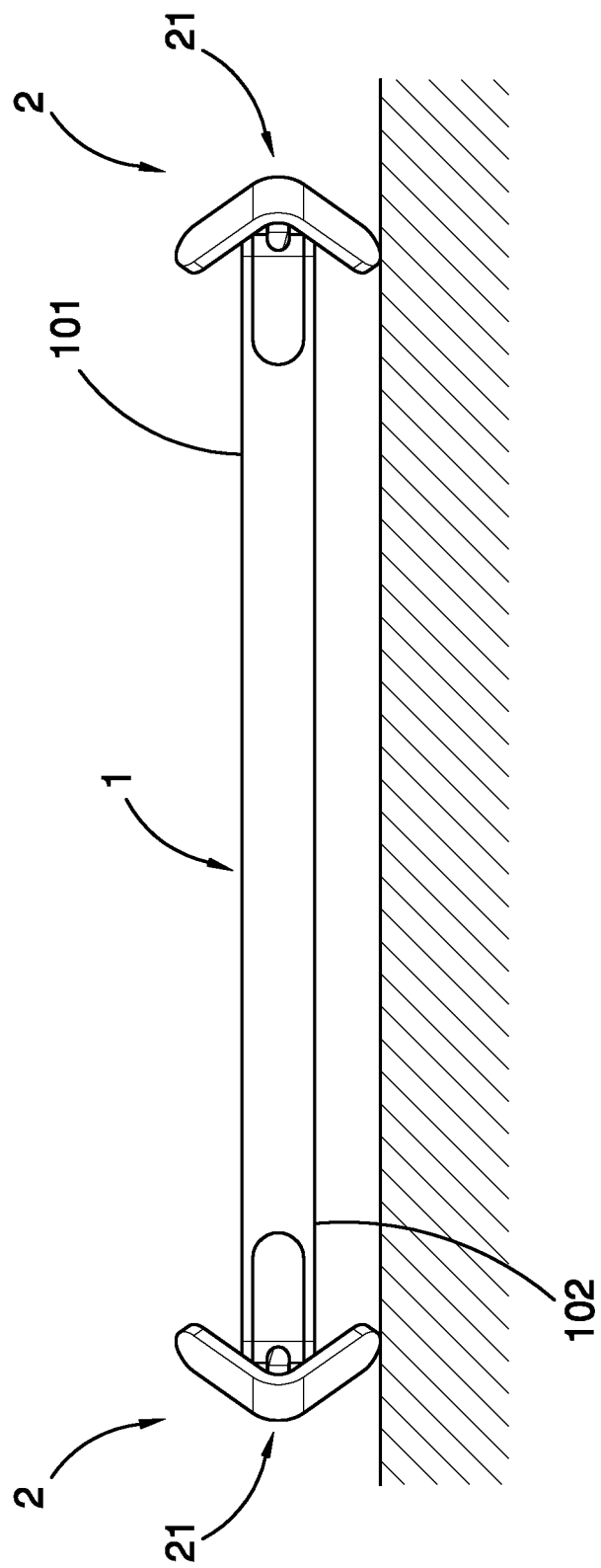
FIG. 7 is a side view of the handheld electronic device at the protective state in accordance with the preferred embodiment.

Each buffer 21 can be driven to rotate at an angle, such as a 90 degree angle so that the front portion 211 and the back portion 212 protrude from the front surface 101 and the back surface 102 of the body 1, as shown in FIGS. 6 and 7. To drive the buffers 21, as shown in FIGS. 2 and 3, each protective device 2 further comprises a driving part 200, which is disposed inside the body 1 and connected to the buffer 21 for driving the corresponding buffer 21 to rotate while receiving the control signal. In the embodiment, as shown in FIGS. 2 and 3, each buffer 21 further comprises a spiral shaft 202, fixed between the front portion 211 and the back portion 212. The spiral shaft 202 is twisted in a helical or spiral shape and extends into the body 1 to connect to the corresponding driving part 200. Each driving part 200 comprises a housing 201 fixed and disposed in the body 1, a compression spring 203 disposed in the housing 201, and at least one buckle 22 able to fasten the buffer 21. In the embodiment, there are two buckles 22 of each driving part 200, which fasten the front portion 211 and the back portion 212 of the buffer 21 respectively to become the state of fasten on the two sides. However, In order to reduce cost and facilitate manufacturing, and to improve space utilization, the driving part 200 could have only one buckle 22 on one side. Furthermore, with one buckle 22, the buckle 22 is not limited to fasten the buffer 21, for example, the buckle 22 can fasten the portion of the spiral shaft 202 between the shell body 201 and the buffer 21.

The housing 201 has a long hole A on its top surface, which the spiral shaft 202 penetrates through. The long hole A has two opposite long sides, which abutting to the spiral shaft 202 respectively; therefore, the spiral shaft 202 is guided by the shape of the spiral shaft 202 and the long hole A so that the spiral shaft 202 can turn at a positive angle or at a negative angle, such as clockwise or counterclockwise, while protruding from or retracting into the long hole A. In the embodiment, the angle is 90 degrees, wherein both the two opposite long sides of the long hole A are preferably slightly arched toward the interior to form an arc so that the spiral shaft 202 can smoothly protrude or retract.

The compression spring 203 is disposed in the housing 201 and disposed between an inner wall of the housing 201 and an end of the spiral shaft 202 for storing elastic force while the spiral shaft 202 is retracted into the housing 201 so that the compression spring 203 is pressed by the spiral shaft 202, and pushes the spiral shaft 202 to protrude the housing 201 by the elastic force.

The buckle 22 is used to fasten the buffer 21, and release the buffer 21 while receiving the control signal to allow the spiral shaft 202 of the buffer 21 to protrude the housing 201. The buckle 22 comprises an electromagnetic valve 220 and a tab 221 driven by the electromagnetic valve 220 to protrude or retract. The tab 221 fastens the buffer 21 in a slot 21a of the buffer 21 after protruding into the slot 21a. On the other hand, the tab 221 detaches the slot 21a after retracting. The electromagnetic valve 220 keeps driving the tab 221 to protrude into the slot 21a to fasten the buffer 21, until the electromagnetic valve 220 receives the control signal to drive the tab 211 to retract and then detach the slot 21a. In addition, the buckle 22 could comprise only one tab 221, and the handheld electronic device could have one or multiple electromagnetic valves 220, which could drive each tab 221 of the buckle 22 to protrude or retract. In one embodiment, to reduce cost, facilitate manufacturing and improve space utilization, the electromagnetic valve 220 could be disposed to approach the shaft center of the handheld electronic device.

When the protective devices 2 is in the initial state as shown in FIG. 1 to FIG. 3, which indicates the buffer 21 is pressed by an user to closely attach to the corner 11 (or the side) of the body 1, the compression spring 203 is pressed by the spiral shaft 202 to store the elastic force. However, since the tab 221 of the buckle 22 protrudes into the slot 21a of the buffer 21 at the same time, the buffer 21 is fastened and cannot be popped up from the corner 11 (or the side) of the body 1 by the compression spring 203. In brief, the buffer 21 is fastened at the time.

Figure 4:
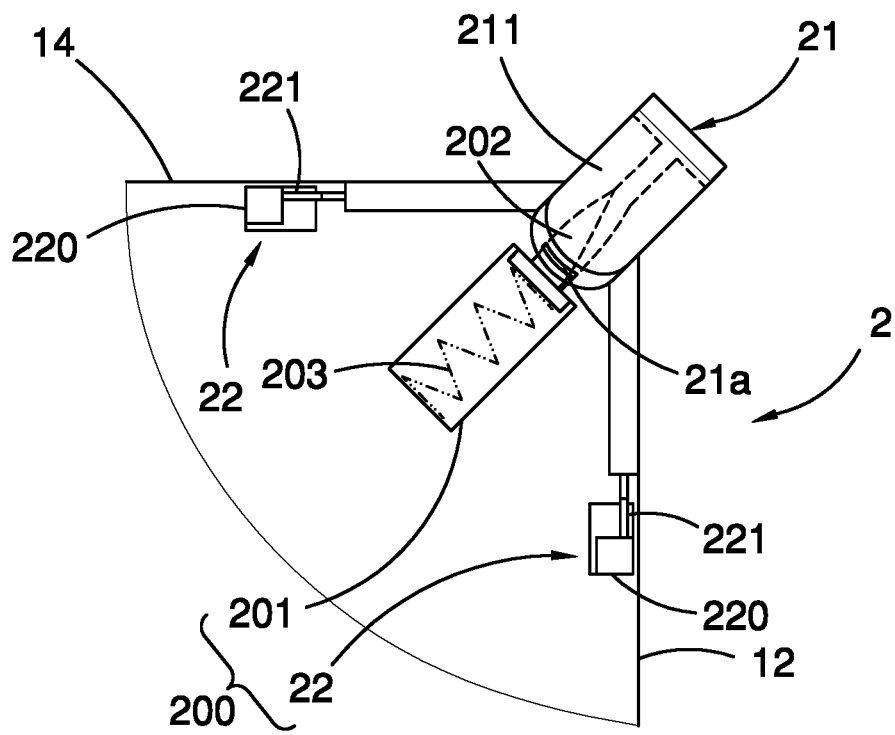
FIG. 4 is a plan view of the one of the protective devices at a protective state in accordance with the embodiment.
Figure 5:
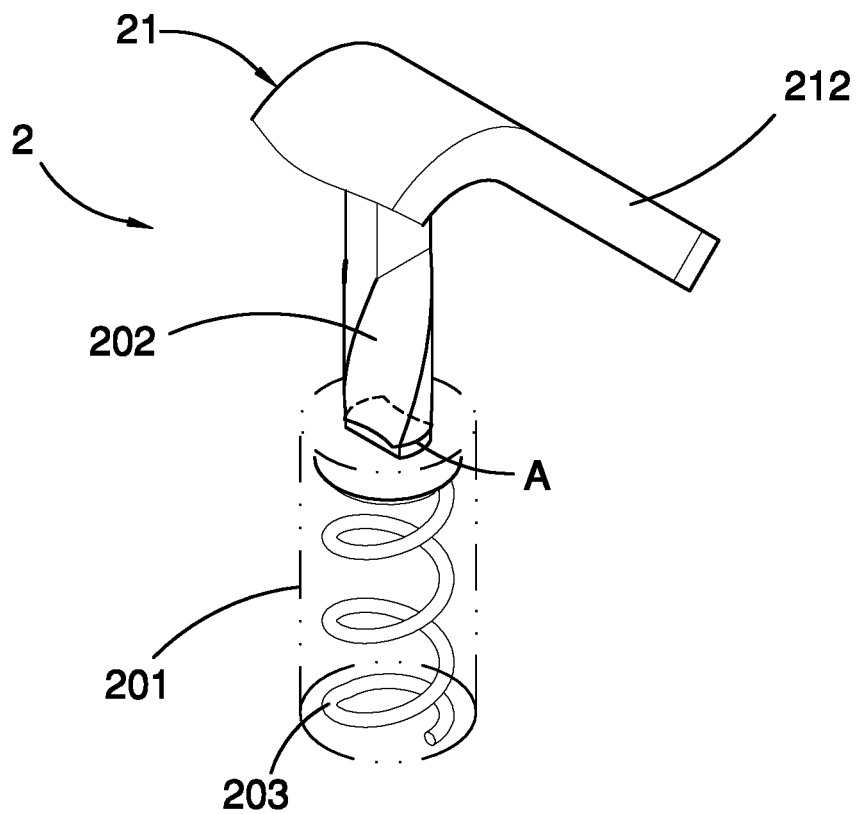
FIG. 5 is a stereogram of the one of the protective devices at the protective state in accordance with the embodiment.

Once the handheld electronic device is dropping, the sensor generates the control signal mentioned above and delivers to the electromagnetic valve 220. The electromagnetic valve 220 drives tab 221 to retract according to the control signal so as to release the buffer 21. Once the buffer 21 is released, the compression spring 203 will utilize the storing elastic force mentioned above to push the spiral shaft 202 to protrude out so that the whole buffer 21 pops out at a distance and turns at a 90 degree angle, as shown in FIGS. 4 and 5. At the time, for the handheld electronic device, the protective devices 2 has been transformed into the protective state as shown in FIGS. 6 and 7, wherein the buffers 21 not only protrude at the distance from the corner 11 (or the side) of the body 1 but their front portion 211 and the back portion 212 protrude from the front surface 101 and the back surface 102 of the body 1 respectively; therefore, the invention can make sure that the handheld electronic device will be safe without concern to hit on the ground when the handheld electronic device is dropping.

After dropped, all the user have to do is press each buffers 21 one by one, so that the spiral shafts 202 of each buffers 21 retract, and the front portion 211 and the back portion 212 of the buffer 21 synchronously turn at a reverse 90 degree angle to the initial position. Thus, each protective device 2 returns from the protective state to the initial state.

For aesthetic, as shown in FIG. 6, the body 1 could have a plurality of recesses 16 corresponding to the buffers 21 to accommodate the buffers 21 so that the front portion 211 and the back portion 212 of the buffers 21 would be flush with the sides of the body 1 in the initial state. To avoid stuck in the recess 16 when the buffer 21 is rotating, in some of the foregoing embodiments, the buffer 21 protrudes at a short distance first and then rotates. However, if the front portion 211 and the back portion 212 of the buffer 21 are slightly higher than the corner 11 (or the side) in the initial state, which means that the front portion 211 and the back portion 212 of the buffer 21 would not be stuck at the corner 11 (or on the side), in this situation, the buffer 21 could be synchronously raised and turned or directly turned without being raised at the angle.

Comparing with the prior phone protective devices, the protective device 2 of the invention includes the two actions of protruding and turning at most; therefore, the structure of the protective device is simpler.

According to the descriptions mentioned above, the handheld electronic device of the invention not only provides the protection by the protective devices immediately while the handheld electronic device is dropping but is also easy to manufacture and assemble; therefore, the invention has the advantage of low cost, and is able to solve the problems of the complex structure and high cost of the conventional phone protective devices.

What is claimed is:

1. A handheld electronic device, comprising:
   a body comprising a front surface, a back surface, and at least one side;
   a sensor disposed in the body and generating a control signal when the handheld electronic device is dropping;
   at least one buffer disposed on the side of the body, and comprising front and rear portions extending in different directions and a spiral shaft formed between the front and back portions and disposed in the body; and
   at least one driving part disposed in the body and comprising:
   a housing comprising a long hole for receiving the spiral shaft so that when the spiral shaft protrudes from the housing, the long hole causes the spiral shaft to rotate to make the front and back portions of the at least one buffer protrude from the front and back surfaces of the body respectively; and
   a compression spring disposed in the housing and compressed by the spiral shaft to store an elastic force while the spiral shaft is retracted into the housing so that the elastic force pushes the spiral shaft to protrude from the housing when the driving part receives the control signal.

2. The handheld electronic device of claim 1, wherein the buffer is driven to protrude a distance from the body by the driving part.

3. The handheld electronic device of claim 2, wherein the buffer is driven to protrude and rotate synchronously by the driving part.

4. The handheld electronic device of claim 1, wherein the driving part comprises a buckle for fastening the buffer, and releasing the buffer while receiving the control signal to allow the spiral shaft of the buffer to protrude from the housing.

5. The handheld electronic device of claim 4, wherein the long hole of the housing comprises two opposite long sides abutted against the spiral shaft respectively so that the spiral shaft is guided by the shape of the spiral shaft and the long hole to turn or reverse at the angle while protruding from or retracting into the long hole.

6. The handheld electronic device of claim 4, wherein the buckle comprises a tab, protruding into a slot of the buffer so as to fasten the buffer, and retracting and detaching the slot while receiving the control signal.

7. The handheld electronic device of claim 6, further comprising an electromagnetic valve, driving the tab of the buckle to protrude into the slot of the buffer so as to fasten the buffer, and to retract and detach the slot while receiving the control signal.

8. The handheld electronic device of claim 1, wherein the body comprises a recess to accommodate the buffer.

9. The handheld electronic device of claim 1, wherein each two adjacent sides form a corner, and the buffer is disposed at the corner of the body.

\* \* \* \* \*